(12) United States Patent
Traijkovic et al.

(10) Patent No.: US 6,445,054 B1
(45) Date of Patent: Sep. 3, 2002

(54) SEMICONDUCTOR DEVICE

(75) Inventors: Tatjana Traijkovic; Florin Udrea; Gehan Anil Joseph Amaratunga, all of Cambridge (GB)

(73) Assignee: Dynex Semiconductor Limited, Lincoln (GB)

( * ) Notice: Subject to any disclaimer, the term of this patent is extended or adjusted under 35 U.S.C. 154(b) by 43 days.

(21) Appl. No.: 09/636,353

(22) Filed: Aug. 10, 2000

(30) Foreign Application Priority Data

Aug. 11, 1999 (GB) .............................................. 9918981

(51) Int. Cl.⁷ .............................................. H01L 23/58
(52) U.S. Cl. ........................ 257/487; 257/495; 257/409
(58) Field of Search ................................ 357/20, 23.13, 357/13; 257/495, 409, 484, 487, 483, 494

(56) References Cited

U.S. PATENT DOCUMENTS

| | | | | |
|---|---|---|---|---|
| 4,602,266 A | * | 7/1986 | Coe | ............................. 357/20 |
| 4,943,835 A | * | 7/1990 | Yakushiji et al. | ........ 357/23.13 |
| 5,075,739 A | * | 12/1991 | Davies | ........................ 357/13 |
| 5,345,101 A | | 9/1994 | Tu | |
| 5,777,373 A | * | 7/1998 | Groenig | ....................... 257/495 |
| 5,905,294 A | * | 5/1999 | Kushida | ...................... 257/409 |

FOREIGN PATENT DOCUMENTS

EP 0 436 171 A1 7/1991

* cited by examiner

*Primary Examiner*—David Nelms
*Assistant Examiner*—Bau T Le
(74) *Attorney, Agent, or Firm*—Pearne & Gordon LLP

(57) ABSTRACT

A semiconductor device comprises an active area with a voltage termination structure located adjacent to the active area at an edge portion of the device. The edge portion comprises a substrate region (12) of a first semiconductor type. The voltage termination structure comprises at least one first termination region (11) of a second semiconductor type, the or each first termination region having at least one of either second and third termination regions (11a, 11b) of third and fourth semiconductor types located at substantially opposing edges thereof. The second and third termination regions (11a, 11b) respectively have a higher semiconductor doping concentration than the edge portion substrate region (12) and a lower semiconductor doping concentration than the first termination region(s) (11).

19 Claims, 2 Drawing Sheets

SEMICONDUCTOR DEVICE

This invention relates to a semiconductor device, and in particular to a high to ultra-high voltage device such as a diode, a DMOSFET, a DMOS IGBT, a MOSFET or a trench IGBT.

In order to prevent voltage breakdown at the edges of a high voltage semiconductor device, the device (which is typically built in a relatively large silicon wafer) is provided with a termination structure. A standard termination structure utilises a floating ring termination technique having, say, p-type regions (rings) in a surface layer surrounding the active region (of n-type material) of the device.

A typical prior art floating ring termination structure is shown in FIG. 1. The termination structure includes a plurality of p+ floating rings 1 formed in a n− base layer 2. The rings 1 are formed just below a passivation layer 3 in the form of a surface field oxide layer, and in general alignment with a p− base 4 and a cathode 5 of the active area (not shown) of the semiconductor device associated with the termination structure. At the extreme edge, the termination structure has a field plate 6 and a channel stopper 7.

The purpose of the p+ floating rings 1 is gradually to release the depletion region, and thus the potential lines from the active area towards the edge of the device. If the separation and the depth of the p+ rings 1 are carefully controlled, the potential lines drop relatively uniformly at the surface between the p+ rings, or between the last p+ ring and the field plate 6, and the breakdown voltage can be close to its ideal value. The termination is said to be successful if it can achieve a breakdown voltage of more than 90% of the bulk value.

The presence of parasitic charge in the passivation layer 3 in the termination area has a strong influence on the depletion layer at the surface, since this charge influences the charge in the depletion layer. It is, therefore, apparent that the higher the doping of the n− base 2, the less severe the effect of the charge is, since the parasitic charge in the passivation layer 3 may not be sufficient to affect the charge equilibrium at the surface of the device. Hence, the effect of the charge is more pronounced in devices rated at higher voltages. A negative charge in the oxide or passivation layer causes a positive charge layer made of holes to form at the surface in the termination area, which positive charge pushes the potential lines away from the main surface, thus forcing the entire potential to drop at the very edge of the device next to the field plate 6. In other words, each ring 1 does not support effectively part of the breakdown voltage. A positive charge in the oxide or the passivation layer results in an accumulation of electrons at the main surface in the termination area. This tends to retard the spreading and the growth of the depletion layer in between the p+ rings 1, which further results in sharp electric field peaks at the p+ floating ring/n− surface junctions. This, in turn, leads to premature breakdown. Therefore, charge of either polarity in the oxide or passivation layer can lower the rated breakdown voltage.

The success of a controllable semiconductor device at high or ultra-high voltages is almost entirely determined by a successful implementation of the edge termination. There are three main reasons which make the termination problem more difficult as the voltage ratings increase. Firstly, the number of floating rings increases significantly, and thus the wasted area and the ratio between the wasted area and the active area increases. This results in a poorer yield and a higher on-state voltage. Secondly, as the voltage increases, and accordingly the doping concentration of the base decreases, the device is more prone to parasitic field charge or passivation charge effects, which may cause premature breakdown. Thirdly, as the number of rings increases, the control of the depth and spacing between the rings becomes even tighter than that for a relatively-lower voltage termination, and therefore the termination effectiveness is very susceptible to process variations.

The aim of the invention is to provide a semiconductor device having an edge termination structure which has a substantially reduced parasitic charge in the passivation layer.

The present invention provides a semiconductor device comprising an active area with a voltage termination structure located adjacent to the active area at an edge portion of the device, the edge portion comprising a substrate region of a first semiconductor type, wherein the voltage termination structure comprises at least one first termination region of a second semiconductor type, the or each first termination region having at least one of either second and third termination regions of third and fourth semiconductor types located at substantially opposing edges thereof, the second and third termination regions respectively having a higher semiconductor doping concentration than the edge portion substrate region and a lower semiconductor doping concentration than the first termination region(s).

Advantageously, the edge portion surrounds the active area, the three termination regions of the voltage termination structure extending around the edge portion, and preferably the three termination regions are formed as rings substantially surrounding the active area. The three termination regions may be provided in the region of an upper surface of the edge portion substrate region, the upper edges of the three termination regions being in alignment with one another, and adjacent to the upper surface of the edge portion substrate region.

Preferably, the or each first termination region extends deeper into the edge portion substrate region than the second and third termination regions.

Conveniently, the second and third termination regions of the voltage termination structure are implanted into the edge portion substrate region, and a passivation layer is provided over the upper surface of the edge portion substrate region. Preferably, the passivation layer is an oxide layer.

The semiconductor device of the invention overcomes the problem of parasitic charge in the passivation layer, and so reduces considerably the affect of this charge on the breakdown voltage of the device.

Advantageously, a channel stopper is provided at an extreme edge of the edge portion substrate region, adjacent to the upper edge of the substrate region, and a field plate is provided above the channel stopper.

In a preferred embodiment, the edge portion substrate region is formed of an n-type semiconductor material, and the or each first termination region is formed of a p-type semiconductor material. In this case, the second and third termination regions are formed of n-type material and p-type material, respectively, the p-type material having a lower doping concentration than the p-type material forming the first termination region(s), and the n-type material having a higher doping concentration than the n-type material forming the edge portion substrate region. Preferably, the first semiconductor type material is n− material, the second semiconductor type material is p+ material, the third semiconductor type material is n material and the fourth semiconductor type material is p material.

The invention will now be described in greater detail, by way of example, with reference to the drawings, in which.

Figure 1:
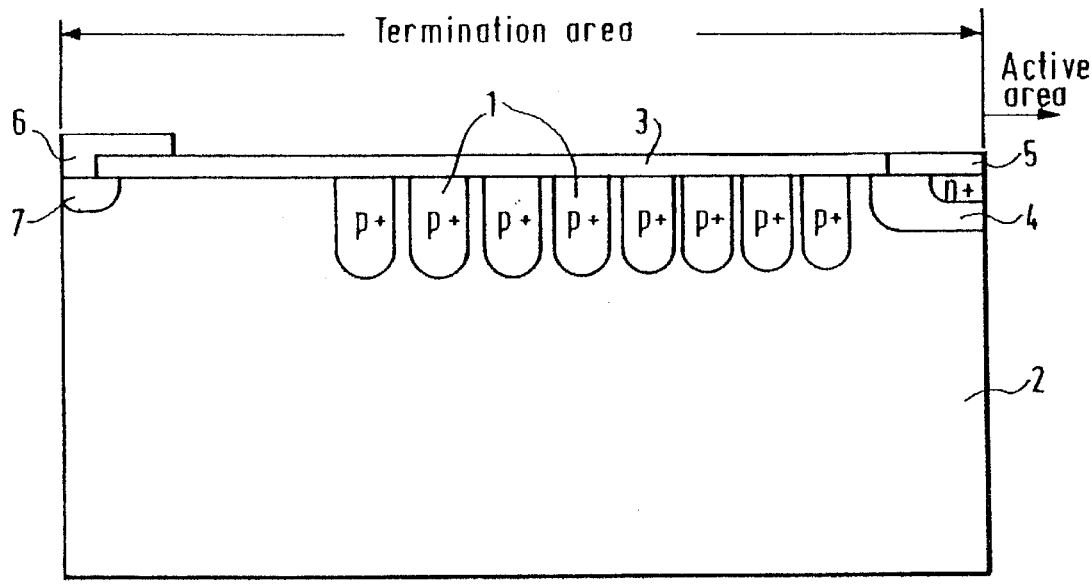
FIG. 1 is a sectional view of a known edge termination structure of a high voltage semiconductor device.
Figure 2:
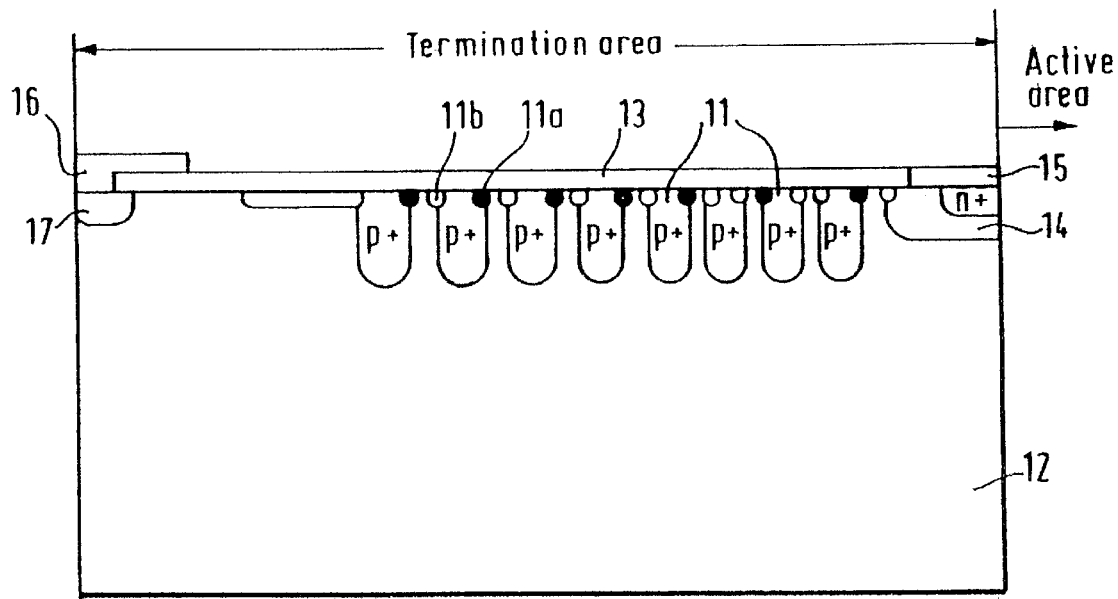
FIG. 2 is a sectional view of an edge termination structure of a high voltage semiconductor device constructed in accordance with the invention.

Referring to the drawings, FIG. 2 shows the edge termination structure of a high voltage semiconductor device, where the active area is not shown. As with the structure of FIG. 1, the edge termination structure of the invention includes a plurality of p+ floating rings 11 formed in a n− drift (base) layer 12, the rings surrounding the active area. The rings 11 are formed just below a passivation layer in the form of a surface field oxide layer 13 in general alignment with a p− base 14 and a cathode 15 of the active area. At the extreme edge, the termination structure has a field plate 16 and a channel stopper 17.

Respective additional n and p shallow rings 11a and 11b are formed on opposite sides of each of the main p+ floating rings 11. These rings 11a and 11b have a lower doping concentration than that of the p+ rings 11, but a higher doping concentration than that of the n− drift layer 12 such that, at the breakdown voltage, either the p rings 11b or the n rings 11a are fully depleted. If no charge is present, it is possible that both the p rings 11b and the n rings 11a are depleted, hence further enhancing the effectiveness of the termination. If a parasitic negative charge is present in the oxide layer 13, the n rings 11a stop the formation of hole channels between adjacent p+ rings 11, and allow effective drop of the potential lines between the p+ rings. In this case, the n rings 11a are fully depleted. If a positive charge is present in the oxide layer 13, the p rings 11b obstruct the formation of the abrupt n+ (electron layer)/p ring junction that would occur in the conventional case, and therefore eliminates the high electric field peaks at the surface. In other words, each of the p rings 11b depletes entirely, and allows a smoother transition of the electric field from the n− drift layer 12 into the p+ rings 11. In case the polarity of the charge is known, the termination may include only one set of the rings 11a and 11b. For a negative charge, the n rings 11a are needed; and, for a positive charge, the p rings 11b are needed.

Such a termination technique was simulated on a 1.4 kV Trench IGBT device (TIGBT), but could be used for any class of TIGBT, for which there already exists an optimised geometry for field ring spacings, where no charge is present in the oxide. The presented technique successfully overcame the problem of severe deterioration of the device's breakdown characteristic, when there was either negative or positive charge in the oxide. The presence of charge has a strong influence on the depletion layer spreading at the surface, because this charge complemented the charge in the depletion layer. A negative surface charge caused a positive charge layer of holes to form at the surface, which layer pushed the potential lines away from the main surface, resulting in an accumulation of potential lines at the very edge of the device. Therefore, each ring did not effectively support part of the breakdown voltage. A positive charge tended to retard the spreading of the depletion layer, and resulted in an accumulation of electrons at the surface, which had the effect of increased pressure on the p+/n surface junction, resulting in a premature breakdown. This demonstrated that parasitic charge of either polarity, in the oxide, could lower the breakdown voltage.

In the case of a 1.4 kV TIGBT, the optimum field ring spacings were determined for the case of having no charge in the oxide. The simulated breakdown voltage, for this case, was 1580V. When charge of either polarity was present in the oxide, the breakdown voltage deteriorated considerably. The values of breakdown voltage (Vbr) for different charges are given in the table below.

Charge-1e12 −5e11 No Charge +5e11 +1e12 Vbr 1180V 1100V 1580V 1500V 870V

In order to reduce the influence of the negative interface charge, a continuous shallow (1 micron) n-implant was provided between the first and the last p+ ring. This resulted in an increased breakdown voltage when compared with a device having no additional implant. Unfortunately, this n-implant had a negative influence on the breakdown voltage when a positive charge in the oxide was present. Accordingly, this method could only be used in the case where the value and sign of the interface charge had already been determined. A trade-off can be achieved when a selective n-implant is performed through the mask, so that it helps to reduce the influence of the negative charge on the breakdown voltage, and not greatly to deteriorate the breakdown characteristics, if there is a positive interface charge. Different placement of this shallow n-implant, when simulated, had a different influence on the breakdown voltage, and as expected, the best placement of the n-islands was found to be on the side of the p+ field ring which is closer to the active area (the right-hand side in FIG. 2). The mask openings were found to be dependent on the spacing between the two adjacent p+ rings. The spacing was chosen so as to be large enough to complement the charge in the oxide, and, on the other hand, small enough not greatly to deteriorate the breakdown characteristic, in the case of a positive interface charge. However, if, together with the shallow n-ring implanted on the side of the p+ ring which is closer to the active area (the right-hand side in FIG. 2), there is also provided a shallow, lowly-doped p-implant (2 microns, 1e16) on the other side of the p+ field ring, the breakdown voltage was found to be little affected by the presence of either positive or negative charge in the oxide.

Figure 3:
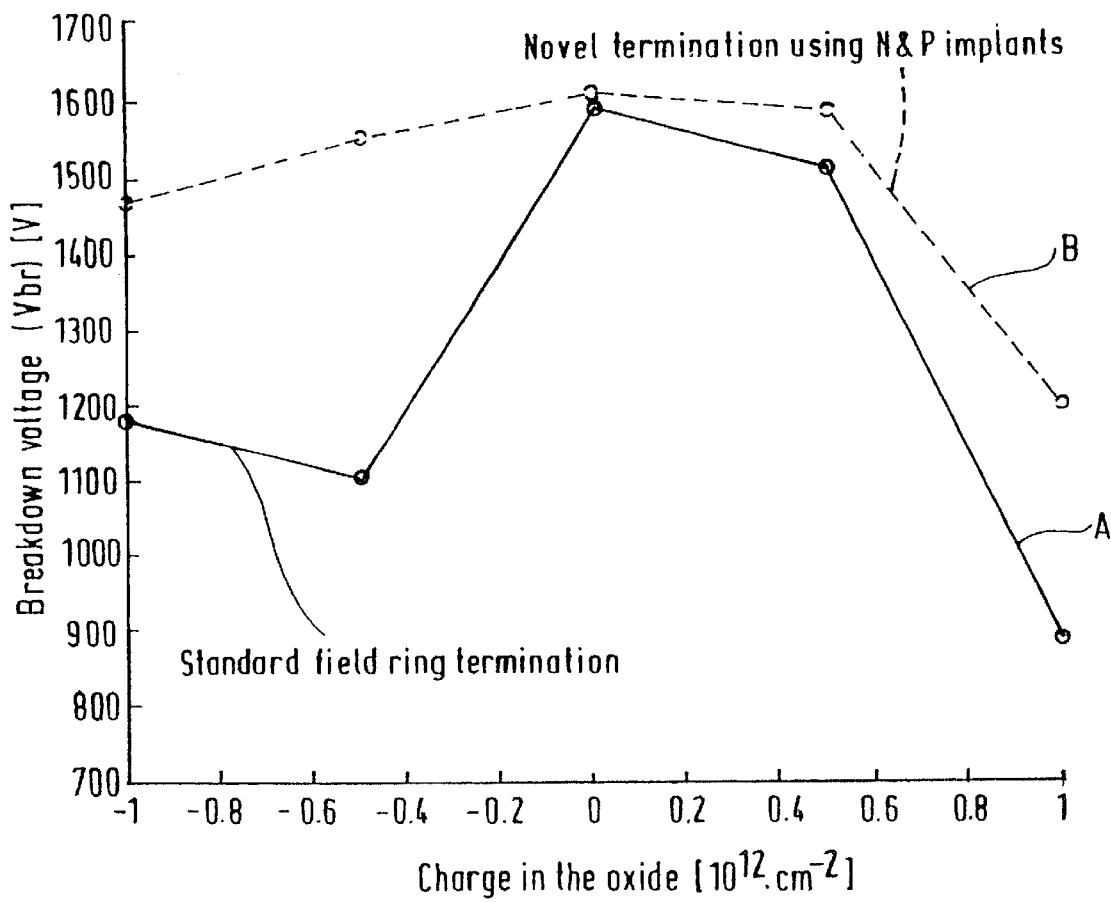
FIG. 3 is a graph showing the breakdown voltages for the edge termination structures of FIGS. 1 and 2.

FIG. 3 is a graph showing the breakdown voltage for the termination structure of structure of FIG. 1 compared with that of FIG. 2 against the charge level in the field oxide layer 3, 13 for a 1.4 kV IGBT, curve A being representative of the known termination structure, and curve B being representative of that described above with reference to FIG. 2. As will be seen, the rings 11a and 11b optimise the p+ rings 11 to give a breakdown voltage of around 1.6 kV. In the case of the known termination structure illustrated in curve A, both a positive sweep and a negative sweep in the oxide layer 3 results in a very significant degradation of the breakdown capability. In contrast, the termination structure of FIG. 2 results in a variation of the breakdown voltage with the parasitic charge which, although present, is far less significant than that which is prevalent in the case of the conventional termination structure of FIG. 1.

It will be apparent that modifications could be made to the semiconductor device described above. For example, in some cases, the termination structure could have a single floating ring 11. Moreover, the or each ring 11 need not be circular in form, any suitable configuration being possible. It is also possible for the ring(s) 11 to extend only partially around the associated active area.

What is claimed is:

1. A semiconductor device comprising an active area with a voltage termination structure located adjacent to the active area at an edge portion of the device, the edge portion comprising a substrate region of a first semiconductor type, wherein the voltage termination structure comprises at least one first termination region of a second semiconductor type, said at least one first termination region having second and third termination regions of third and fourth semiconductor types located at substantially opposing edges thereof, the second and third termination regions respectively having a higher semiconductor doping concentration than the edge portion substrate region and a lower semiconductor doping concentration than said at least one first termination region.

2. A semiconductor device according to claim 1, wherein the edge portion surrounds the active area, the three termination regions of the voltage termination structure extending around the edge portion.

3. A semiconductor device according to claim 2, wherein the three termination regions are found as rings substantially surrounding the active area.

4. A semiconductor device according to any preceding claim, wherein the three termination regions are provided in the region of an upper surface of the edge portion substrate region.

5. A semiconductor device according to claim 4, wherein the upper edges of the three termination regions are in alignment with one another.

6. A semiconductor device according to claim 4 or claim 5, wherein the upper edges of the three termination regions are adjacent to the upper surface of the edge portion substrate region.

7. A semiconductor device according to claim 5 or claim 6, wherein the or each first termination region extends deeper into the edge portion substrate region than the second and third termination regions.

8. A semiconductor device according to any preceding claim, wherein the second and third termination regions of the voltage termination structure are implanted into the edge portion substrate region.

9. A semiconductor device according to any preceding claim, wherein a passivation layer is provided over the upper surface of the edge portion substrate region.

10. A semiconductor device according to claim 9, wherein the passivation layer is an oxide layer.

11. A semiconductor device according to any preceding claim, wherein a channel stopper is provided at an extreme edge of the edge portion substrate region, adjacent to the upper edge of the substrate region.

12. A semiconductor device according to claim 11, wherein a field plate is provided above the channel stopper.

13. A semiconductor device according to any preceding claim, wherein the edge portion substrate region is formed of an n-type semiconductor material, and the or each first termination region is formed of a p-type semiconductor material.

14. A semiconductor device according to claim 13, wherein the second and third termination regions are formed of n-type material and p-type material, respectively, the p-type material having a lower doping concentration than the p-type material forming the first termination region(s), and the n-type material having a higher doping concentration than the n-type material forming the edge portion substrate region.

15. A semiconductor device according to claim 14, wherein the first semiconductor type material is n– material, the second semiconductor type material is p+ material, the third semiconductor type material is n material and the fourth semiconductor type material is p material.

16. A semiconductor device according to any preceding claim, wherein the device performs as a diode, a DMOSFET, a DMOS, IGBT, a MOSFET, a trench IGBT, or an MOS controllable power device.

17. A semiconductor device comprising an active area with a voltage termination structure located adjacent to the active area at an edge portion of the device, the edge portion comprising a substrate region of a first semiconductor type, wherein the voltage termination structure comprises at least one first termination region of a second semiconductor type, said at least one first termination region having a second termination region of a third semiconductor type located at an edge thereof, said at least one second termination region respectively having a higher semiconductor doping concentration than the edge portion substrate region and a lower semiconductor doping concentration than said at least one first termination region.

18. A semiconductor device according to claim 17, wherein the first semiconductor type material is n material, the second semiconductor type material is p+ material, the third semiconductor type material is n material and said at least second termination region is located on that edge of the respective first termination region further from the active area of the device.

19. A semiconductor device according to claim 17, wherein the first semiconductor type material is n– material, the second semiconductor type material is p+ material, the third semiconductor type material is p material, and said at least one second termination region is located at that edge of the respective first termination region never to the active area of the device.

* * * * *